(12) United States Patent
Shibazaki

(10) Patent No.: US 8,115,906 B2
(45) Date of Patent: Feb. 14, 2012

(54) MOVABLE BODY SYSTEM, PATTERN FORMATION APPARATUS, EXPOSURE APPARATUS AND MEASUREMENT DEVICE, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 499 days.

(21) Appl. No.: 12/332,624

(22) Filed: Dec. 11, 2008

(65) Prior Publication Data

US 2009/0161086 A1    Jun. 25, 2009

Related U.S. Application Data

(60) Provisional application No. 61/006,818, filed on Jan. 31, 2008, provisional application No. 61/071,883, filed on May 22, 2008.

(30) Foreign Application Priority Data

Dec. 14, 2007   (JP) ................................ 2007-324004
Apr. 30, 2008   (JP) ................................ 2008-119266

(51) Int. Cl.
*G03B 27/58* (2006.01)
(52) U.S. Cl. ...................................... 355/72
(58) Field of Classification Search ............ 355/53, 355/72; 359/616
See application file for complete search history.

(56) References Cited

U.S. PATENT DOCUMENTS

| | | |
|---|---|---|
| 4,780,617 A | 10/1988 | Umatate et al. |
| 5,196,745 A | 3/1993 | Trumper |
| 5,448,332 A | 9/1995 | Sakakibara et al. |
| 5,610,715 A | 3/1997 | Yoshii et al. |
| 5,646,413 A | 7/1997 | Nishi |
| 6,611,316 B2 | 8/2003 | Sewell |
| 6,778,257 B2 | 8/2004 | Bleeker et al. |
| 6,791,699 B2 | 9/2004 | Aoki |

(Continued)

FOREIGN PATENT DOCUMENTS

EP    1 710 629 A2    10/2006

(Continued)

OTHER PUBLICATIONS

May 18, 2011 Office Action issued in Chinese Patent Application No. 200880018726.0 (with translation).

(Continued)

*Primary Examiner* — Edward Glick
*Assistant Examiner* — Deoram Persaud
(74) *Attorney, Agent, or Firm* — Oliff & Berridge, PLC

(57) ABSTRACT

A movable body system is equipped with a stage having a stage main section which moves along an XY plane and a stage which is finely movable in a direction (a Z-axis direction) orthogonal to the XY plane and a tilt direction with respect to the XY plane, and a measurement device which measures positional information of the stage within the XY plane. The measurement device has a plurality of encoder heads arranged on the table, and optical fibers whose end sections are arranged facing each head at the stage main section and the optical axes at the end sections are substantially parallel to the Z-axis direction, and the device measures positional information of the stage, based on an output of a head facing a grating section placed substantially parallel to the XY plane. And, air transmission of a signal is performed between each of the heads and the end section of the optical fibers.

19 Claims, 8 Drawing Sheets

U.S. PATENT DOCUMENTS

| | | |
|---|---|---|
| 6,819,425 B2 | 11/2004 | Kwan |
| 7,023,610 B2 | 4/2006 | Ohtsuki et al. |
| 7,025,498 B2 | 4/2006 | del Puerto |
| 7,102,729 B2 | 9/2006 | Renkens et al. |
| 7,161,659 B2 | 1/2007 | Van Den Brink et al. |
| 7,238,931 B2 | 7/2007 | Nabeshima et al. |
| 2002/0018220 A1 | 2/2002 | Aoki |
| 2002/0041377 A1 | 4/2002 | Hagiwara et al. |
| 2003/0025890 A1 | 2/2003 | Nishinaga |
| 2005/0128461 A1 | 6/2005 | Beems et al. |
| 2005/0140955 A1* | 6/2005 | Butler et al. ............... 355/69 |
| 2005/0259234 A1 | 11/2005 | Hirukawa et al. |
| 2006/0023178 A1 | 2/2006 | Loopstra et al. |
| 2006/0023194 A1 | 2/2006 | Loopstra et al. |
| 2006/0061750 A1* | 3/2006 | Van De Ven ............... 355/72 |
| 2006/0139595 A1 | 6/2006 | Koenen et al. |
| 2006/0146305 A1* | 7/2006 | Magome et al. .......... 355/53 |
| 2006/0170892 A1 | 8/2006 | Koenen et al. |
| 2006/0227309 A1 | 10/2006 | Loopstra et al. |
| 2007/0097341 A1* | 5/2007 | Hikima ..................... 355/53 |
| 2007/0273860 A1* | 11/2007 | Tanaka ...................... 355/72 |
| 2007/0288121 A1* | 12/2007 | Shibazaki ................. 700/213 |

FOREIGN PATENT DOCUMENTS

| | | |
|---|---|---|
| JP | A-04-198714 | 7/1992 |
| JP | A-09-269249 | 10/1997 |
| JP | A-2002-048601 | 2/2002 |
| JP | A-2006-332656 | 12/2006 |
| JP | A-2007-129194 | 5/2007 |
| WO | WO 01/35168 A1 | 5/2001 |
| WO | WO 2007/083758 A1 | 7/2007 |

OTHER PUBLICATIONS

Jan. 27, 2009 Written Opinion of the International Searching Authority issued in International Patent Application No. PCT/JP2008/003735 (with translation).

English Language Translation of JP-A-2002-048601 (International Search Report of corresponding PCT Application No. PCT/JP2008/003735).

English Language Translation of JP-A-2006-332656 (International Search Report of corresponding PCT Application No. PCT/JP2008/003735).

English Language Translation of WO 2007/083758 A1.

* cited by examiner

MOVABLE BODY SYSTEM, PATTERN FORMATION APPARATUS, EXPOSURE APPARATUS AND MEASUREMENT DEVICE, AND DEVICE MANUFACTURING METHOD

CROSS-REFERENCE TO RELATED APPLICATIONS

This non-provisional application claims the benefit of Provisional Application No. 61/006,818 filed Jan. 31, 2008, and Provisional Application No. 61/071,683 filed May 22, 2009, the disclosures of which are hereby incorporated herein by reference in its entirety.

BACKGROUND OF THE INVENTION

1. Field of the Invention

The present invention relates to movable body systems, pattern formation apparatus, exposure apparatus and measurement devices, and device manufacturing methods, and more particularly, to a movable body system including a movable body which substantially moves along a predetermined plane, a pattern formation apparatus which is equipped with the movable body system, an exposure apparatus which is equipped with the movable body system, a measurement device arranged in an exposure apparatus, and a device manufacturing method which uses the exposure apparatus.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

However, semiconductor devices will lead to higher integration in the future, and accompanying this, it is certain that the circuit pattern which should be formed on the wafer will become finer, and further improvement of the position detection precision of wafers and the like will be required in the exposure apparatus which is the mass-production apparatus for semiconductor devices.

For example, in U.S. Patent Application Publication No. 2006/0227309, an exposure apparatus which has an encoder type sensor (an encoder head) mounted on a substrate table is disclosed. However, in the case when an encoder head is installed on the substrate table, because the substrate table performs a vertical and inclined movement, there was a risk of the tension which acts on wiring for supplying power and the like to the encoder head interfering with the smooth movement of the substrate table. In the case when a plurality of encoder heads is installed on the substrate table, dragging of such wiring could become a major obstacle.

SUMMARY OF THE INVENTION

According to a first aspect of the present invention, there is provided a movable body system including a movable body which moves along a predetermined plane, the system comprising: a movable body having a main section which moves along the predetermined plane and a table member which can finely move in at least a direction orthogonal to the predetermined plane and a tilt direction with respect to the predetermined plane on the main body section; and a measurement device having a plurality of encoder heads arranged on the table member, and measures positional information of the movable body within the predetermined plane, based on an output of at least one encoder head which faces a grating section placed substantially parallel with the predetermined plane outside the movable body, whereby the measurement device has a transmitting and receiving equipment which performs transmitting and receiving of a measurement beam and/or a signal by wireless communication between each of the plurality of encoder heads and a component outside the encoder heads.

Wireless communication, in this case, widely includes communication using electromagnetic waves, and includes not only wireless communication by microwave or electric waves of other frequencies, but also wireless communication using infrared radiation and other optical wireless communications. In the description, the term wireless communication is used in such a sense.

According to the movable body system of the present invention, the measurement device has a transmitting and receiving equipment which performs transmitting and receiving of a measurement beam and/or a signal by wireless communication between each of the plurality of encoder heads arranged on the table member and a component outside the encoder heads. Therefore, even if the main section of the movable body moves along a predetermined plane, and the table member also moves finely in a direction orthogonal to the predetermined plane, measurement light and transmitting and receiving of the measurement beam and/or the signal between each of the plurality of encoder heads and the component outside the encoder heads can be performed without any problems. Accordingly, positional information of the movable body within the predetermined plane can be measured with good precision, without being affected by the fine movement of the table member.

According to a second aspect of the present invention, there is provided an exposure apparatus that exposes an object with an energy beam, the apparatus comprising: a stage assembly which has a table member that holds the object and is movable in a direction orthogonal to a predetermined plane, and a main section which supports the table member in a non-contact manner and moves in a direction parallel to the predetermined plane, a grating section to which the table member faces and is arranged substantially parallel to the predetermined plane; and a measurement device which has a plurality of encoder heads arranged on the table member, and a transmitting and receiving equipment which performs transmitting and receiving of a measurement beam and/or a signal by wireless communication between each of the plurality of encoder heads and a component outside the encoder heads, and measures positional information of the table member within the predetermined plane based on an output of at least one encoder head facing the grating section.

According to the exposure apparatus of the present invention, the measurement device has a transmitting and receiving equipment which performs transmitting and receiving of a measurement beam and/or a signal by wireless communication between each of the plurality of encoder heads arranged on the table members which holds the object and is movable in the direction orthogonal to the predetermined plane, and the component outside the encoder heads. Further, the table member is supported in a non-contact manner by the main section of the stage assembly. Therefore, in the case the main section of the stage assembly moves along a predetermined plane, and the table member also moves finely in a direction orthogonal to the predetermined plane, measurement light and transmitting and receiving of the measurement beam and/or the signal between each of the plurality of encoder heads and the component outside the encoder heads can be performed without any problems by wireless communication. Accordingly, the position of the stage assembly related to the predetermined plane can be obtained with good precision, without being affected by the fine movement of the table member, which in turn makes it possible to perform exposure with high precision of the object held by the table member, while controlling the position of the stage assembly within the predetermined plane with high precision on exposure.

According to a third aspect of the present invention, there is provided a measurement device arranged in an exposure apparatus exposing an object held by a stage assembly with an energy beam that measures positional information of the object in a predetermined plane, the device comprising: a plurality of encoder heads which are arranged on a table member of the stage assembly that holds the object and is movable in a direction orthogonal to the predetermined plane; and a transmitting and receiving equipment in which at least a part of the equipment is arranged at a main section of the stage assembly that supports the table member in a non-contact manner and moves in a direction parallel to the predetermined plane, and performs transmitting and receiving of a measurement beam and/or a signal by wireless communication between each of the plurality of encoder heads and a component outside the encoder heads, whereby positional information of the table member within the predetermined plane is measured, based on an output of at least one encoder head which faces a grating section arranged substantially parallel with the predetermined plane outside the movable body.

According to the measurement device of the present invention, positional information of the table member within a predetermined plane can be measured with good precision, without being affected by the fine movement of the table member in the direction orthogonal to the predetermined plane.

BRIEF DESCRIPTION OF THE DRAWINGS

In the accompanying drawings.

DESCRIPTION OF THE EMBODIMENTS

A First Embodiment

Hereinafter, a first embodiment of the present invention will be described with reference to FIGS. 1 to 6.

Figure 1:
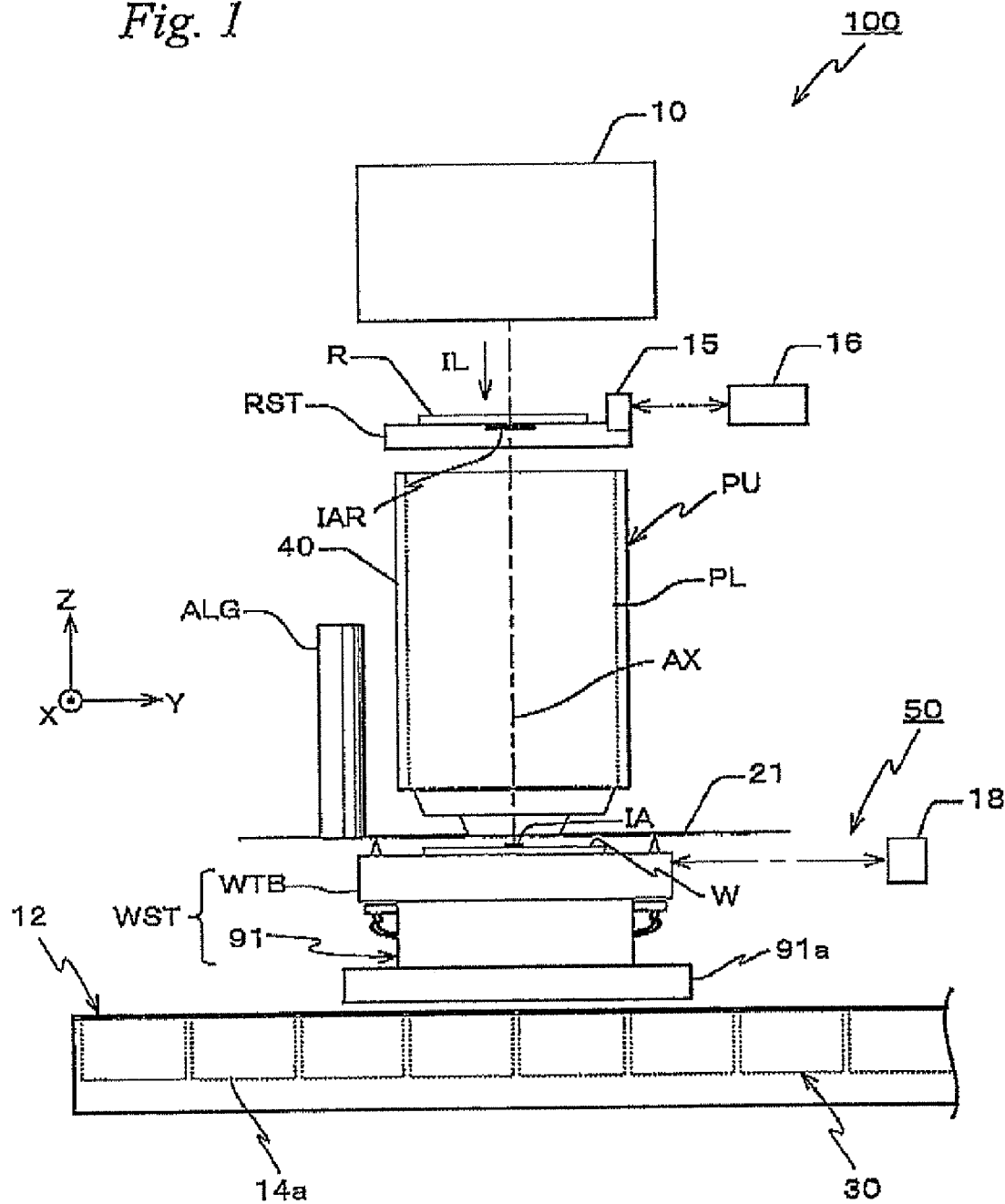
FIG. 1 is a view that shows a schematic configuration of an exposure apparatus of an embodiment.

FIG. 1 shows a schematic configuration of an exposure apparatus 100 in the first embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as $\theta x$, $\theta y$, and $\theta z$ directions, respectively.

Exposure apparatus 100 is equipped with an illumination system 10, a reticle stage RST holding reticle R, a projection unit PU, a wafer stage device 50 including wafer stage WST on which a wafer W is mounted, a control system for these parts and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR, which is set on reticle a with a reticle blind (a masking system), by an illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 6) that includes a linear motor or the like, and reticle stage PST is also drivable in a scanning direction (in this case, the Y-axis direction, which is the lateral direction of the page surface in FIG. 1) at a predetermined scanning speed.

The positional information (including rotation information in the $\theta z$ direction) of reticle stage RST in the XY plane (movement plane) is constantly detected, for example, at a resolution of around 0.25 nm by a reticle laser interferometer (hereinafter referred to as a "reticle interferometer") 16, which irradiates a measurement beam on a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) shown in FIG. 1.

Projection unit PU is placed below (−Z side) reticle stage RST in FIG. 1, and is held by a part of a body (not shown). Projection unit PO has a barrel 40, and a projection optical system PL consisting of a plurality of optical elements held by barrel 40. As projection optical system PL, for example, a dioptric system is used, consisting of a plurality of lenses (lens elements) that has been disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area TAR, illumination light IL that has passed through reticle R which is placed so that its pattern surface substantially coincides with a first plane (an object plane) of projection optical system PL forms a reduced image of the circuit pattern (a reduced image of a part of the circuit pattern) of reticle R formed within illumination area IAR, via projection optical system PL, in an area (exposure area) IA conjugate to illumination area IAR on wafer W whose surface is coated with a resist (a sensitive agent) and is placed on a second plane (an image plane) side of projection optical system PL. And by the synchronous drive of reticle stage RST and wafer stage WST, reticle R relatively moves in the scanning direction (the Y-axis direction) with respect to illumination area TA (illumination light IL) while wafer W relatively moves in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10, reticle R, and projection optical system PL, and then by the exposure of the sensitive layer (resist layer) on wafer W with illumination light IL, the pattern is formed on wafer W.

In the periphery on the −Z side end of barrel 40, a scale plate 21 is placed parallel to the XY plane, at a height substantially flush with a surface on the lower end of barrel 40. In the embodiment, scale plate 21 consists of a rectangular plate which has a circular opening in which the −Z end of barrel 40 is inserted and a circular opening in which the −Z end of an alignment system is inserted the circular opening formed in a part of the plate, and is supported by suspension from a body (not shown) On the lower surface (a surface on the −Z side) of scale plate 21, a reflection type two-dimensional grating RG (refer to FIGS. 4 and 5) is formed, consisting of a grating whose periodic direction is in the Y-axis direction having a predetermined pitch of, for example, 1 μm, and a grating whose periodic direction is in the X-axis direction having a predetermined pitch of, for example, 1 μm. Two-dimensional grating RG covers the movement range of wafer stage WST.

Wafer stage device 50 is equipped with a stage base 12 supported almost horizontally by a plurality of (e.g. three or four) vibration isolation mechanisms (omitted in the drawings) on the floor surface, a wafer stage WST placed above stage base 12, a wafer stage drive system 27 (only a part of the system shown in FIG. 1, refer to FIG. 6), an encoder system to be described later, a wafer laser interferometer system and the like.

Stage base 12 is made of a member having a tabular form, and the degree of flatness of the upper surface is extremely high and serves as a guide surface when wafer stage WST moves. Inside stage base 12, a coil unit is housed, including a plurality of coils 14a placed in the shape of a matrix with the XY two-dimensional direction serving as a row direction and a column direction.

As shown in FIG. 1, wafer stage WST has a stage main section 91, and a wafer table WTB which is placed above stage main section 91 and is supported in a non-contact manner with respect to stage main section 91 by a Z tilt drive mechanism (not shown). In this case, wafer table WTB is supported in a non-contact manner by Z tilt drive mechanism by adjusting the balance of the upward force (repulsion) such as the electromagnetic force and the downward force (gravitation) including the self-weight at three points, and is also finely driven in directions of three degrees of freedom, which are the Z-axis direction, the θx direction, and the θy direction. At the bottom of stage main section 91, a slider section 91a is arranged. Slider section 91a has a magnetic unit made up of a plurality of magnets arranged two-dimensionally within the XY plane, a housing to house the magnetic unit, and a plurality of air bearings arranged in the periphery of the bottom surface of the housing. For example, the magnet unit configures a planar motor 30 employing a drive method which uses the Lorentz force (electromagnetic force) disclosed in, for example, U.S. Pat. No. 5,196,745, along with the coil unit previously described. Incidentally, as planar motor 30, the drive method is not limited the Lorentz force (electromagnetic force), and a planar motor by a variable reluctance drive system can also be used.

Wafer stage WST is supported by levitation above stage base 12 by a predetermined clearance, such as around several μM, by the plurality of air bearings described above, and is driven in the X-axis direction, the Y-axis direction, and the θz direction by planar motor 30 described above. Accordingly, wafer table WTB is drivable with respect to stage base 12 in directions of six degrees of freedom.

Figure 6:
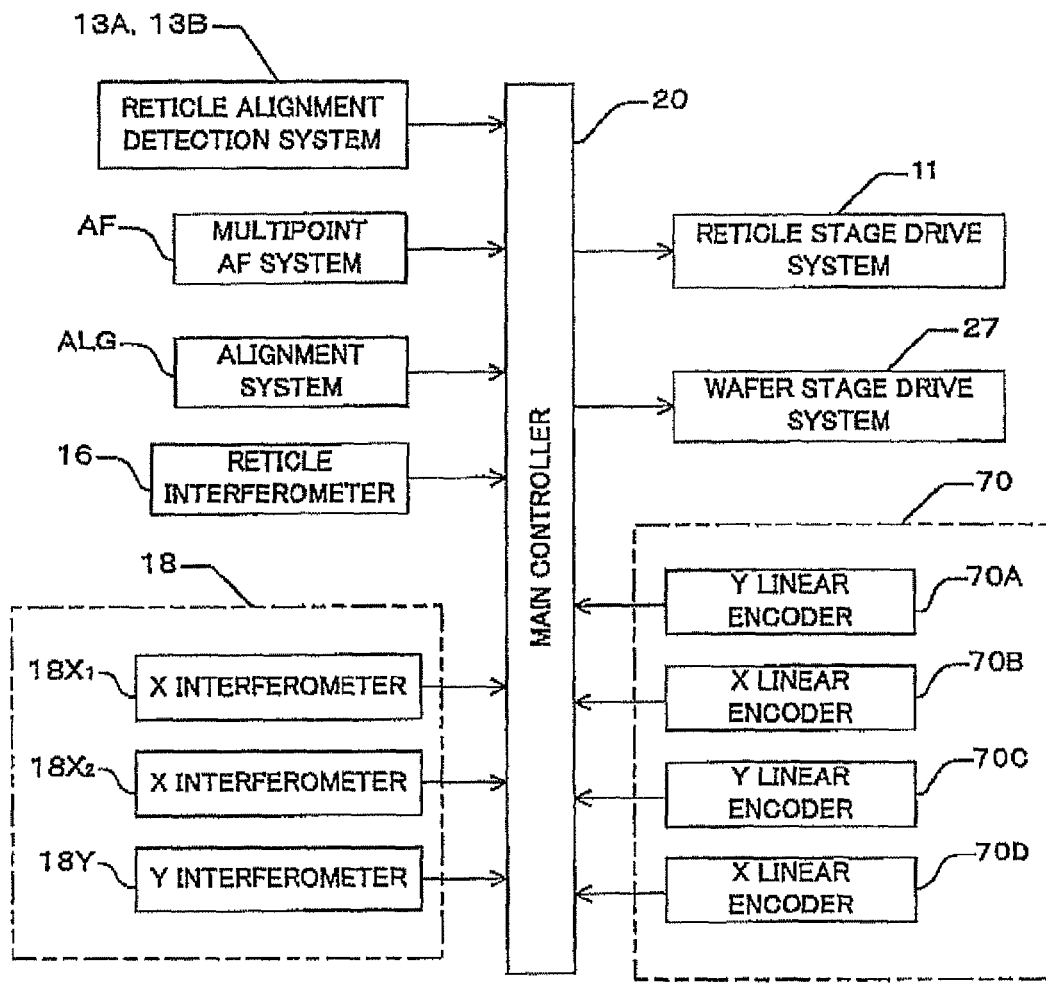
FIG. 6 is a block diagram showing a main configuration of a control system related to stage control of the exposure apparatus in FIG. 1.

In the embodiment, a main controller 20 controls the magnitude and direction of current supplied each of the coils 14a configuring the coil unit. Wafer stage drive system 27 in FIG. 6 is configured, including planar motor 30 and the Z tilt drive mechanism previously described. Incidentally, as planar motor 30, a magnetic levitation type planar motor can be used.

On wafer table WTB, wafer W is mounted via a wafer holder (not shown), and is fixed by a chuck mechanism (not shown), such as, for example, vacuum suction (or electrostatic adsorption).

Further, a configuration is employed where positional information of wafer stage WST in the XY plane is measurable by encoder system 70 (not shown in FIG. 1, refer to FIG. 6). Hereinafter, details on a configuration and the like of encoder system 70 will be described.

On the upper surface of water table WTB, as shown in a planar view in FIG. 2, encoder heads (hereinafter, shortly referred to as a head, as needed) 60A to 60D are attached in the four corners, respectively. These heads 60A to 60D are housed within through-holes in the Z-axis direction which have been formed in wafer table WTB, respectively, as shown in FIG. 3 with head 60C taken up as a representative.

In this case, a pair of heads 60A and 60C, which is located on one of the diagonal lines of wafer table WTB, are heads whose measurement direction is in the Y-axis direction. Further, a pair of heads 60B and 60D, which is located on the other diagonal line of wafer table WTB, are heads whose measurement direction is in the X-axis direction. As each of the heads 60A to 60D, a head having a configuration similar to the head (encoder) disclosed in, for example, U.S. Pat. No. 7,238,931, the pamphlet of International Publication No. 2007/083758 and the like is used. However, in the embodiment, the light source and the photodetector are arranged external to each head, and only the optical system is arranged inside of each head. And the light source and photodetector, and the optical system are optically connected via an optical communication path which includes an optical fiber that will be described later on.

Heads 60A and 60C configure Y linear encoders 70A and 70C (refer to FIG. 6), respectively, which measure the position of wafer stage WST in the Y-axis direction by irradiating measurement beams on scale plate 21 and receiving diffraction beams from the grating whose periodic direction is the Y-axis direction formed on the surface (lower surface) of scale plate 21. Further, heads 60B and 60D configure X linear encoders 70B and 70D (refer to FIG. 6), respectively, which measure the position of wafer stage WST in the X-axis direction by irradiating measurement beams on scale plate 21 and receiving diffraction beams from the grating whose periodic direction is the X-axis direction formed on the surface of scale plate 21.

Figure 3:
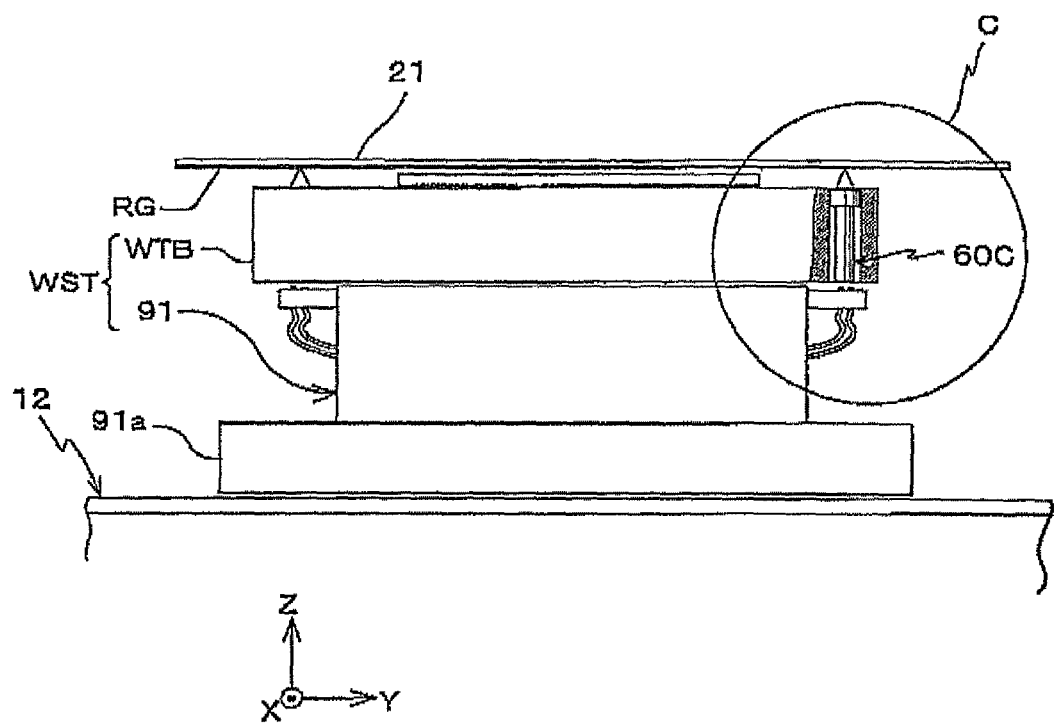
FIG. 3 is an enlarged view of the wafer stage in FIG. 1 partially broken.
Figure 4:
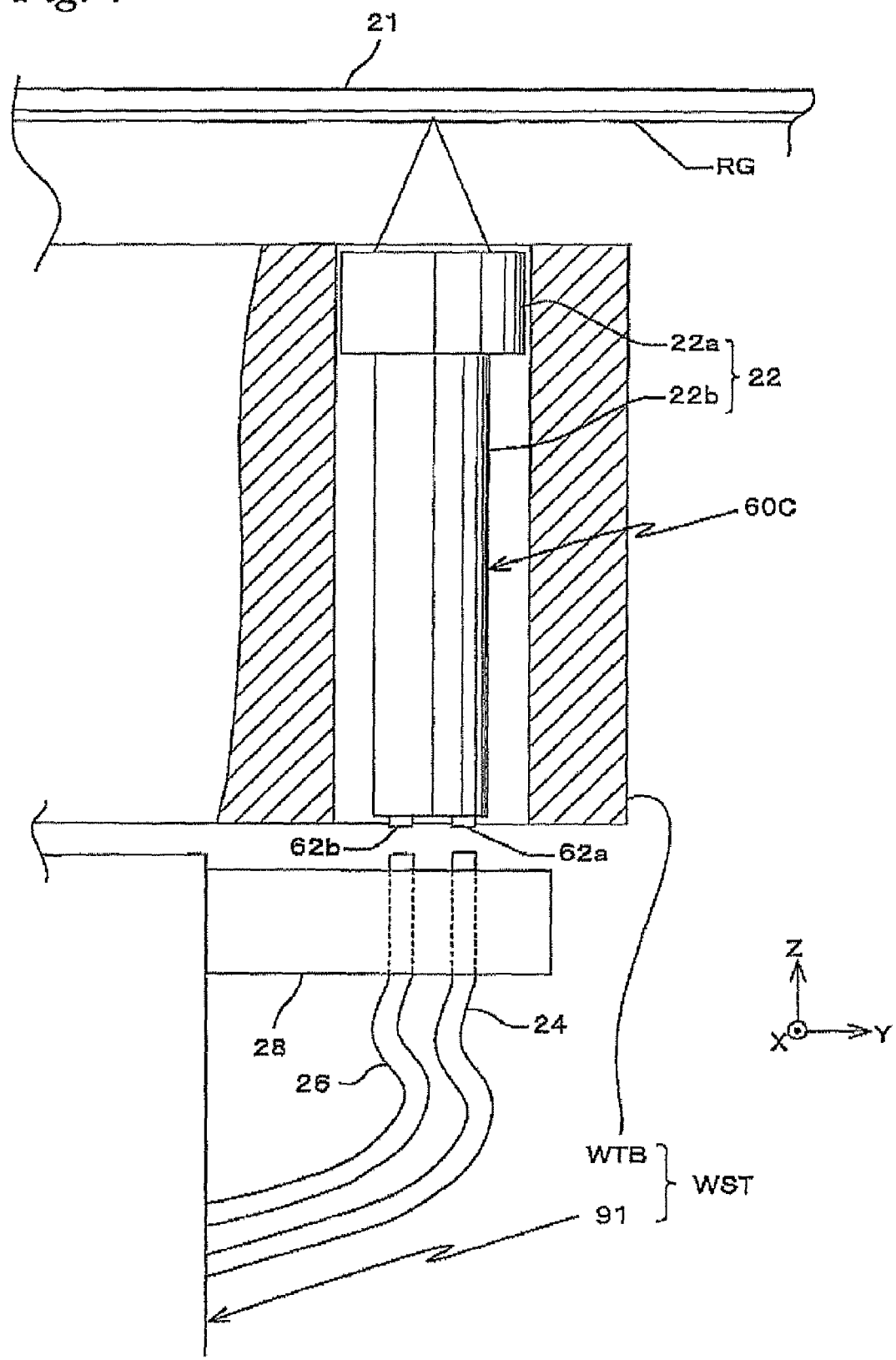
FIG. 4 is a view that shows a part of the inside of a circle C in FIG. 3 enlarged.

In the embodiment, as shown in FIG. 4, which is a view of a part of circle C in FIG. 3 enlarged, head 60C has a housing 22 which has two sections; an optical system housing section 22a having a cylindrical shape whose height is shorter than the diameter, and a cylindrical shaped fiber housing section 22b having a cylindrical shape of a predetermined length arranged extending in the Z-axis direction below optical system housing section 22a. Outside the lower end surface of fiber housing section 22b, short waveguides, such as for example, one end of optical fibers 62a and 62b are exposed to the outside. The other end of optical fibers 62a and 62b are connected, respectively, to an optical system inside optical system housing section 22a (refer to FIG. 5) as it will be described later on. One end of optical fibers 24 and 26 are placed, respectively, facing one end of optical fibers 62a and 62b. Incidentally, in FIG. 4, for the sake of convenience, the gap between optical fibers 62a and 62b and optical fibers 24 and 26 is shown larger than the actual size.

Optical fibers 24 and 26 are held by a fiber holding section 28 arranged projecting at the upper end of stage main section 91 so that each one end is in parallel with the Z-axis. Optical fiber 24 which has been arranged so that one end faces optical fiber 62a is a light-sending fiber, and the other end of optical fiber 24 is optically connected to a light source arranged in stage main section 91, such as for example, a semiconductor laser and the like. Further, optical fiber 26 which has been arranged so that one end faces optical fiber 62b is a light-receiving fiber, and is optically connected to a photodetection system (not shown) which includes a polarizer (an analyzer) and a photodetector arranged in stage main section 91, such as for example, a photomultiplier tube and the like.

Figure 5:
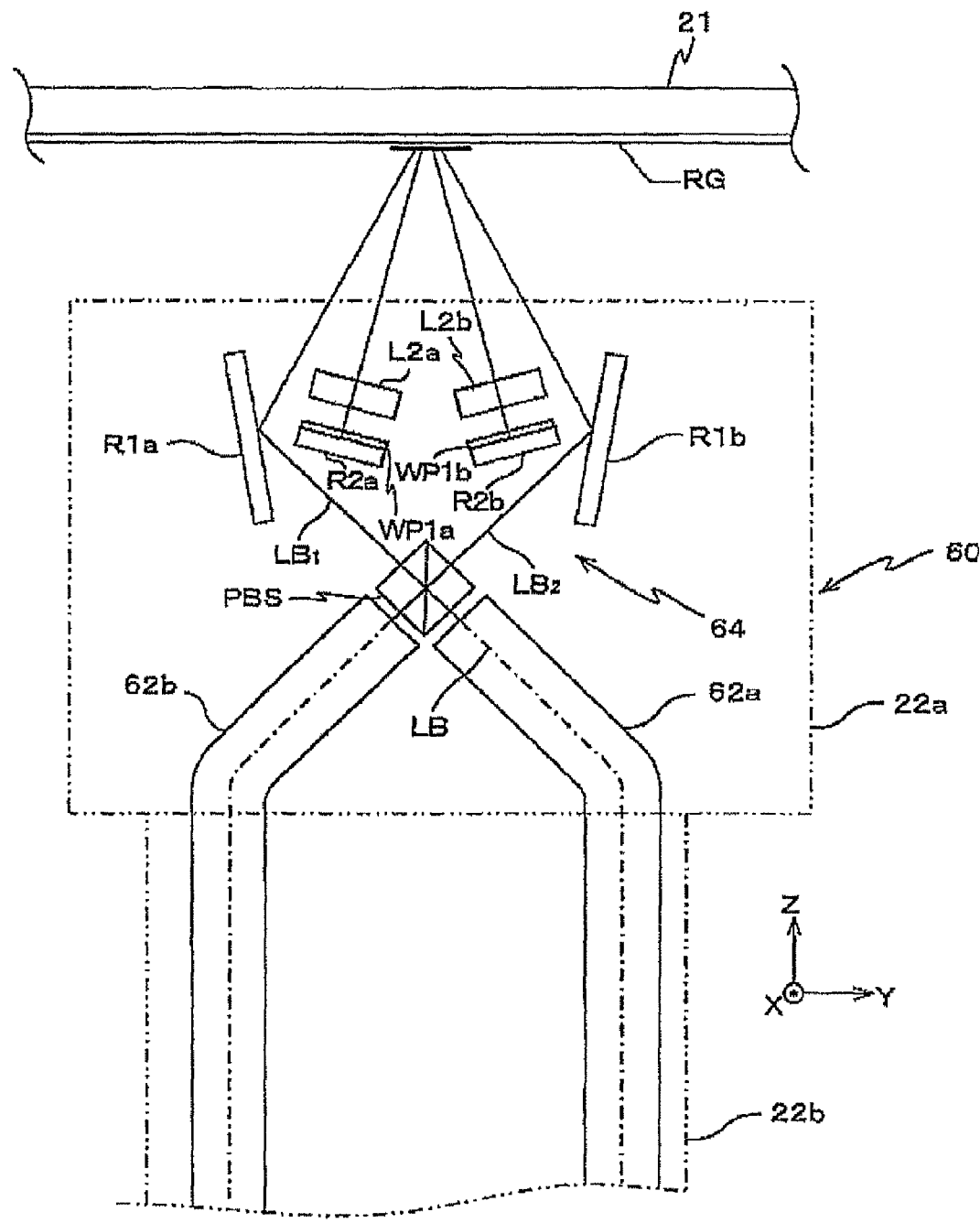
FIG. 5 is a view used to explain an internal configuration of a head.

A schematic configuration of the optical system inside head 60C will be described, based on FIG. 5. Inside optical system housing section 22a of head 60C, an optical system 64 including a polarization beam splitter PBS whose separation plane is parallel to an XZ plane, a pair of reflection mirrors R1a and R1b, lenses L2a and L2b, quarter wavelength plates (hereinafter, referred to as a λ/4 plate) WP1a and WP1b, reflection mirrors R2a and R2b, and the like is housed.

The surface of the other end of optical fiber 62a is placed facing the incidence plane of beam splitter PBS, and the surface of the other end of optical fiber 62b is placed facing the outgoing plane of beam splitter PBS.

In Y encoder 70C configured by head 60C, a laser beam LB (measurement beam) emitted from the light source is incident on polarization beam splitter PBS via optical fiber 24, an atmospheric layer, and optical fiber 62a, sequentially, which is split by polarization into two beams $LB_1$ and $LB_2$. Beam $LB_1$ having been transmitted through polarization beam splitter PBS reaches the reflection type two-dimensional grating RG formed on scale plate 21, via reflection mirror R1a, and beam $LB_2$ reflected off polarization beam splitter PBS reaches the two-dimensional grating RG via reflection-mirror R1b. Incidentally, "split by polarization" in this case means the splitting of an incident beam into a P-polarization component and an S-polarization component.

Predetermined-order diffraction beams that are generated from diffraction grating RG due to irradiation of beams $LB_1$ and $LB_2$, for example, the first-order diffraction beams are severally converted into a circular polarized light by λ/4 plates WP1b and WP1a via lenses L2b and L2a, and reflected by reflection mirrors R2b and R2a and then the beams pass through λ/4 plates WP1b and WP1a again and reach polarization beam splitter PBS by tracing the same optical path in the reversed direction.

Each of the polarization directions of the two beams that have reached polarization beam splitter PBS is rotated at an angle of 90 degrees with respect to the original direction. Therefore, the first-order diffraction beam of beam $LB_1$ that was previously transmitted through polarization beam splitter PBS is reflected off polarization beam splitter PBS and is incident on the photodetection system, via optical fiber 62b, the atmospheric layer, and optical fiber 26, sequentially, and also the first-order diffraction beam of beam $LB_2$ that was previously reflected off polarization beam splitter PBS is transmitted through polarization beam splitter PBS and is synthesized coaxially with the first-order diffraction beam of beam $LB_1$ and is incident on the photodetection system, via optical fiber 62b, the atmospheric layer, and optical fiber 26, sequentially.

Then, the polarization directions of the two first-order diffraction beams described above are uniformly arranged by the analyzer inside the photodetection system so that the beams interfere with each other to be an interference light, and the interference light is detected by the photodetector and is converted into an electric signal in accordance with the intensity of the interference light.

As is obvious from the above description, in Y encode 70C (encoder head 60C), since the optical path lengths of the two beams to be interfered are extremely short and also are almost equal to each other, the influence by air fluctuation can mostly be ignored. Then, when wafer stage WST moves in the measurement direction (in this case, the Y-axis direction or more specifically, head 60C moves relatively in the measurement direction with respect to scale plate 21 (two-dimensional grating RG), the phase of the two beams changes, respectively, which changes the intensity of the interference light. This change in the intensity of the interference light is detected by the photodetection system and positional information corresponding to the intensity change is output as a measurement value of Y encoder 70C. Other heads 60A, 60B, and 60D (encoders 70A, 70B, and 70D) and the like are also configured similarly with head 60C (encoder 70C).

Incidentally, in the description above, heads 60A to 60D each have optical fibers 62a and 62b, and corresponding to optical fibers 62a and 62b equipped in each of the heads 60A to 60D individually, a total of eight optical fibers 24 and 26 are arranged in stage main section 91. However, besides such a configuration, the number of optical fibers need not be specified as long as the light (measurement beam) from one or a plurality of light sources can be guided to optical fiber 62a that heads 60A to 60D each have by air transmission, and the light (optical information) from optical fiber 62b that heads 60A to 60D each have can also be guided individually, to the photodetection system arranged in stage main section 91 by air transmission. For example, instead of optical fibers 24 and 26, an optical fiber (e.g., a dual-core optical fiber) which performs bidirectional optical transmission can be arranged in each head, which makes a total of four optical fibers arranged in stage in section 91.

From a similar point, the optical fiber in fiber housing section 22b is not limited to two optical fibers.

Further, in the embodiment, the position of wafer table WTB can be measured by a wafer laser interferometer system (hereinafter called the "wafer interferometer system") 18 (refer to FIG. 6), independent of encoder system 70.

Figure 2:
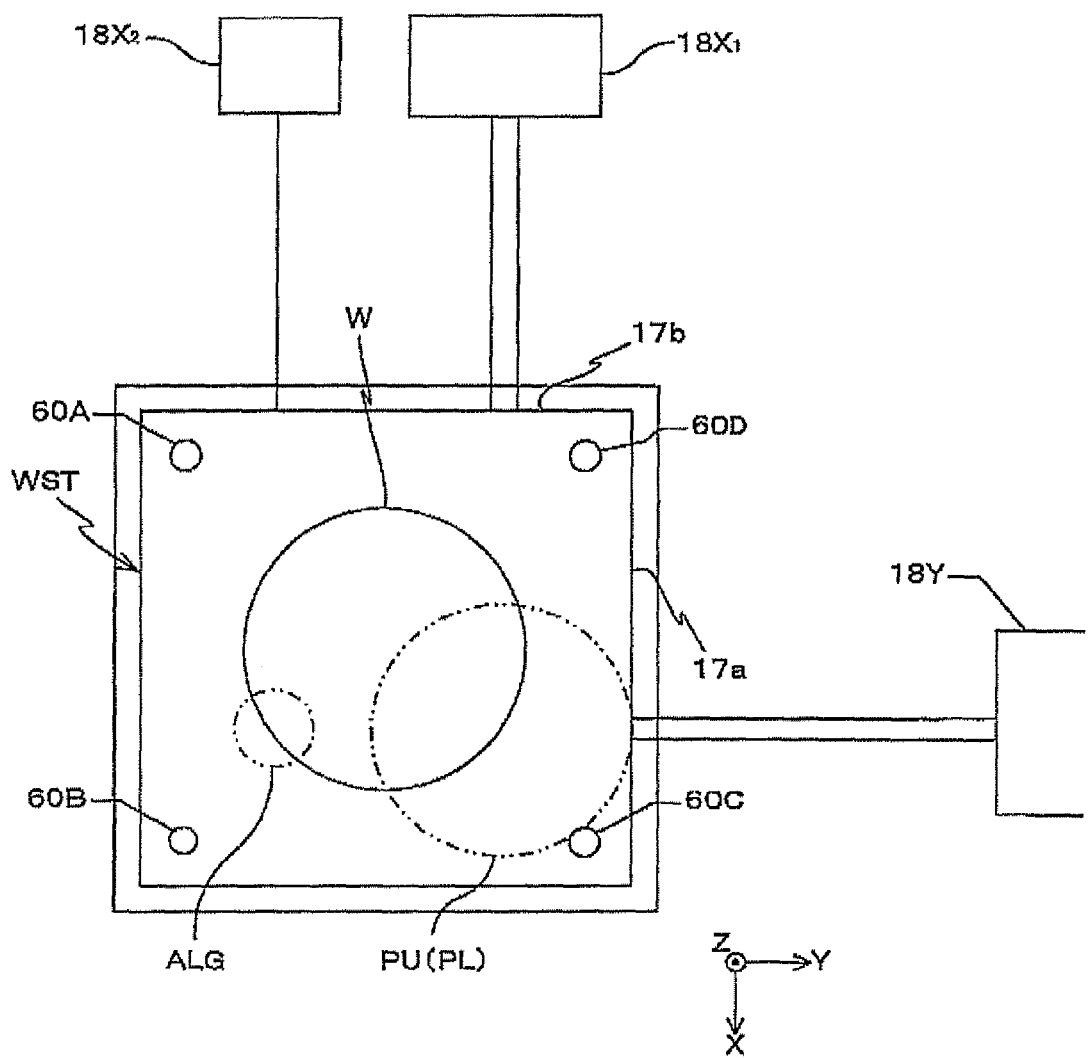
FIG. 2 is a view used to explain a placement of encoder heads and interferometers.

On a surface on the +Y side (the +Y edge surface) and a surface on the −X side (the −X edge surface) of wafer table WTB, respectively, mirror-polishing is applied and reflection surfaces 17a and 17b are formed (refer to FIG. 2). Wafer interferometer system 18 is equipped with at least one Y interferometer 18Y which irradiates a plurality of measurement beams in the Y-axis direction on reflection surface 17a and a plurality of X interferometers, in the embodiment, two X interferometers $18X_1$ and $18X_2$, which irradiate one or more than one measurement beams in the X-axis direction on reflection surface 17b (refer to FIG. 2 and FIG. 6).

The substantial measurement axis in the Y-axis direction of Y interferometer 18Y is a straight line parallel to the Y-axis direction which passes through optical axis AX of projection optical system PL and the detection center of alignment system ALG which will be described later on. Y interferometer, 18Y measures the positional information of wafer table WTB in the Y-axis direction, the θz direction, and the θx direction.

Further, the substantial measurement axis in the X-axis direction of X interferometer $18X_1$ is a straight line parallel to the X-axis direction which passes through optical axis A, of projection optical system PL. X interferometer $18X_1$ measures the positional information of wafer table WTB in the X-axis direction and in the θy direction (and the θz direction).

Further, the measurement axis of X interferometer $18X_1$ is a straight line parallel to the X-axis direction which passes through the detection center of alignment system ALG X interferometer $18X_2$ measures the positional information of wafer table WTB in the X-axis direction and in the θy direction.

Incidentally, for example, instead of reflection surfaces 17a and 17b described above, a movable mirror consisting of a plane mirror can be attached to the end of wafer table WTB. Further, a reflection surface 45 inclined at an angle of 45 degrees to the XY plane can be arranged on wafer table WTB, and the position of wafer table WTB in the Z-axis direction can be measured via the reflection surface.

The measurement values of each of the interferometers of wafer interferometer system 18 are supplied to controller 20 (refer to FIG. 6). In the embodiment, however, position information within the XY plane (including the positional information (rotation information) in the θz direction) of wafer stage WST (wafer table WTB) is mainly measured by encoder system 70 described above, and the measurement values of interferometers 18Y, $18X_1$, and $18X_2$ are secondarily used in cases such as when long-term fluctuation (for example, by temporal deformation or the like of the scales) of the measurement values of the encoder system is corrected (calibrated), or as backup at the time of output abnormality in the encoder system.

Alignment system ALG is placed on the −Y side of projection optical system PL away by a predetermined distance. In the embodiment, as alignment system ALG, for example, an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signals from alignment system ALG are supplied to controller 20 in FIG. 6.

Incidentally, alignment system ALG is not limited to the FIA system, and an alignment sensor, which irradiates a coherent detection light to a subject mark and detects a scattered light or a diffracted light generated from the subject mark or makes two diffracted lights (for example, diffracted lights of the same order or diffracted lights being diffracted in the same direction) generated from the subject mark interfere and detects an interference light, can naturally be used alone or in combination as needed.

In addition, in exposure apparatus 100 of the embodiment a multiple point focal point position detection system (hereinafter shortly referred to as a multipoint AF system) AF (not shown in FIG. 1, refer to FIG. 6) by the oblique incidence method having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 6), via an AF signal processing system (not shown). Main controller 20 detects positional information of the wafer W surface in the Z-axis direction at a plurality of detection points based on the detection signals of multipoint AF system AF, and performing a so-called focus leveling control of wafer W during the scanning exposure based on the detection results. Incidentally, multipoint AF system can be arranged in the vicinity of alignment system ALG and surface position information (unevenness information) of the wafer surface can be obtained beforehand at the time of wafer alignment, and at the time of exposure, the surface position information and measurement values of a different sensor detecting a position of the wafer stage upper surface in the Z-axis direction can be used to perform the so-called focus leveling control of water W.

Exposure apparatus 300, furthermore, is equipped with a pair of reticle alignment systems 13A and 13B (not shown in FIG. 1, refer to FIG. 6) above reticle R, consisting of TTR (Through The Reticle) alignment systems which use light of the exposure wavelength. Detection signals of reticle alignment detection systems 13A and 13B are supplied to main controller 20 via an alignment signal processing system (not shown).

FIG. 6 is a block diagram showing a partially omitted control system related to stage control in exposure apparatus 100. This control system is mainly configured of main controller 20. Main controller 20 includes a so-called microcomputer (or workstation) consisting of a CPU (Central Processing Unit), ROM (Read Only Memory), RAM (Random Access Memory) and the like, and has overall control over the entire apparatus.

In exposure apparatus 100 configured in the manner described above, on manufacturing devices, reticle alignment and baseline measurement of alignment system ALG are performed in a procedure similar to an typical scanning stepper (a procedure disclosed in, for example, U.S. Pat. No. 5,646,41 and the like) using reticle alignment detection systems 13A and 13B, a fiducial plate (not shown) on wafer table WTB and the like previously described, and around this time, wafer alignment (Enhanced Global Alignment (EGA)) which is disclosed in, for example, U.S. Pat. No. 4,780,617 and the like) and the like are performed.

Then, main controller 20 performs an exposure operate on by the step-and-scan method, based on the measurement results of the baseline and the results of the wafer alignment, and a pattern of reticle R is transferred onto each of a plurality of shot areas on wafer W. This exposure operation is performed by alternately repeating a scanning exposure operation where synchronous movement of reticle stage RST and wafer stage WST previously described is performed, and a movement (stepping) operation between shots where wafer stage RST is moved to an acceleration starting position for exposure of the shot area.

During the scanning exposure above, main controller 20 controls the position of wafer table WTB in the XY plane while measuring positional information (including the rotation information in the θz direction) in the KY plane of wafer table WTB, using encoder system 70, and also performs the so-called focus leveling control of wafer W where a part (an area corresponding to exposure area IA) of the shot area subject to exposure of wafer W is made to be coincident within the depth of focus of projection optical system PL by driving (not shown) Z tilt drive mechanism based on measurement values of multipoint AF system AF. Therefore, water table WTB is driver in at least one direction of the Z-axis direction, the θx direction, and the θy direction during the focus leveling In this case, because the movable stroke of wafer table WTB in the Z-axis direction is around 100 μm (50 μm above and below a neutral position), for example, when viewing from the arrangement position of each head, wafer table WTB is merely driven substantially along the Z-axis in a stroke equal to or less than around 100 μm. Therefore, for example, when looking at head 60C, the distance between the end surface of optical fibers 62a and 62b and the end surface of optical fibers 24 and 26 widens only to around 100 μm at maximum. Accordingly, the air transmission between optical fibers 24 and 62a of laser beam $LB_1$ and the air transmission between optical fibers 62b and 26 of the first-order diffraction beams of beams $LB_1$ and LB2 previously described are hardly affected. The same can be said for the other heads.

Therefore, according to exposure apparatus 100 of the embodiment, the position (including the rotation in the θz direction) of wafer stage WST in the XY plane can be controlled with high precision, based on the measurement information of each encoder of encoder system 70 while performing the so-called focus leveling control of wafer W.

As described above, according to the embodiment, encoder system 70 has optical fibers 24 and 26 that have one end arranged at stage main section 91 of wafer stage WST facing each of the plurality of heads 60A to 60D arranged on wafer table WTB, and whose optical axes at the one end are substantially parallel to a direction (the Z-axis direction) orthogonal to the XY plane. And, between each of heads 60A to 60D, or to be more precise, optical fibers 62a and 62b equipped inside each of the heads 60A to 60D, and one end of optical fibers 24 and 26, air transmission of laser beam LB, and the first-order diffraction beams of $LB_1$ and $LB_2$ is performed. Therefore, even if stage main section 91 moves along the XY plane (along the upper surface of stage base 12), and wafer table WTB moves finely in at least one direction of the Z-axis direction orthogonal to the XY plane, the θx direction, and the θy direction for the focus leveling control of the wafer, because each of the heads 60A to 60D only move finely only in a direction (the Z-axis direction) along the optical axis in the end of optical fibers 24 and 26, air transmission of laser beam $LB_1$ and the first-order diffraction beams of $LB_1$ and $LB_2$ can be performed without any problems between each head and optical fibers 24 and 26. Accordingly, positional information of wafer stage WST in the XY plane can be measured with good precision, without being affected by the fine movement of wafer table WTB.

Further, according to the embodiment, wafer table WTB is supported in a non-contact manner with Z tilt drive mechanism (not shown) to stage main section 91 of wafer stage WST. Therefore, in the case stage main section 91 moves along the XY plane (along the upper surface of stage base 12), and wafer table WTB moves finely in at least one direction of the Z-axis direction orthogonal to the XY plane, the θx directions and the θy direction, each of the heads 60A to 60D only moves finely in a direction (the Z-axis direction) along the optical axis in the end of optical fibers 24 and 26 in a non-contact manner to the main section. Accordingly, air transmission of laser beam LB, and the first-order diffraction beams of $LB_1$ and $LB_2$ can be performed without any problems between each head and optical fibers 24 and 26. In addition to this, in the embodiment, because each of the heads 60A to 60D attached to wafer table WTB only has an optical system built in, wiring to supply power to stage main section 91 and to the heads attached to wafer table WTB, or to communicate the output signals of the head will be unnecessary. Therefore, no problems occur in particular even if a plurality of encoder heads is attached to wafer table WTB.

Further, because there is no wiring and the like connected to heads 60A to 60D, the Z tilt drive of wafer table WTB can be performed smoothly, without any adverse effects by the tension of the wiring and the like. Therefore, the positional information of wafer stage WST in the XY plane can be obtained with good precision without being affected by the fine movement of wafer table WTB, which makes it possible to control the position of wafer stage WST in the XY plane with high precision on exposure and to perform a highly precise exposure of wafer W held by wafer table WTB. Further, because the light source and the photodetector which become a heat source are not arranged inside the head, the influence of heat on wafer table WTB can be reduced.

Incidentally, in the embodiment above, while the case has been described where the light source and the photodetection system (including the photodetector) are placed external (stage main section 91) to heads 60A to 60D, and between the light source, the photodetection system, and each of the heads 60A to 60D, air transmission of both the light (measurement beam) from the light source and the light returning (signal light (optical information)) to the photodetector from the encoder head is performed, the present invention is not limited to this.

A Second Embodiment

Next, a second embodiment of the present invention will be described, referring to FIGS. 7 and 8. Here, the same reference numerals will be used for the same or similar sections as in the first embodiment previously described, and a detailed description thereabout will be omitted. The exposure apparatus of the second embodiment differ only in a part of the configuration inside each encoder head which differs when compared with the exposure apparatus of the first embodiment previously described and the point where optical fiber 26 is not arranged, and with such configurations, the point where a receiver 32 is arranged at stage main section 91 (or, at other appropriate places external to the encoder head) of wafer stage WST. Accordingly, the exposure apparatus of the second embodiment will be described below, focusing mainly on such differences.

Figure 7:
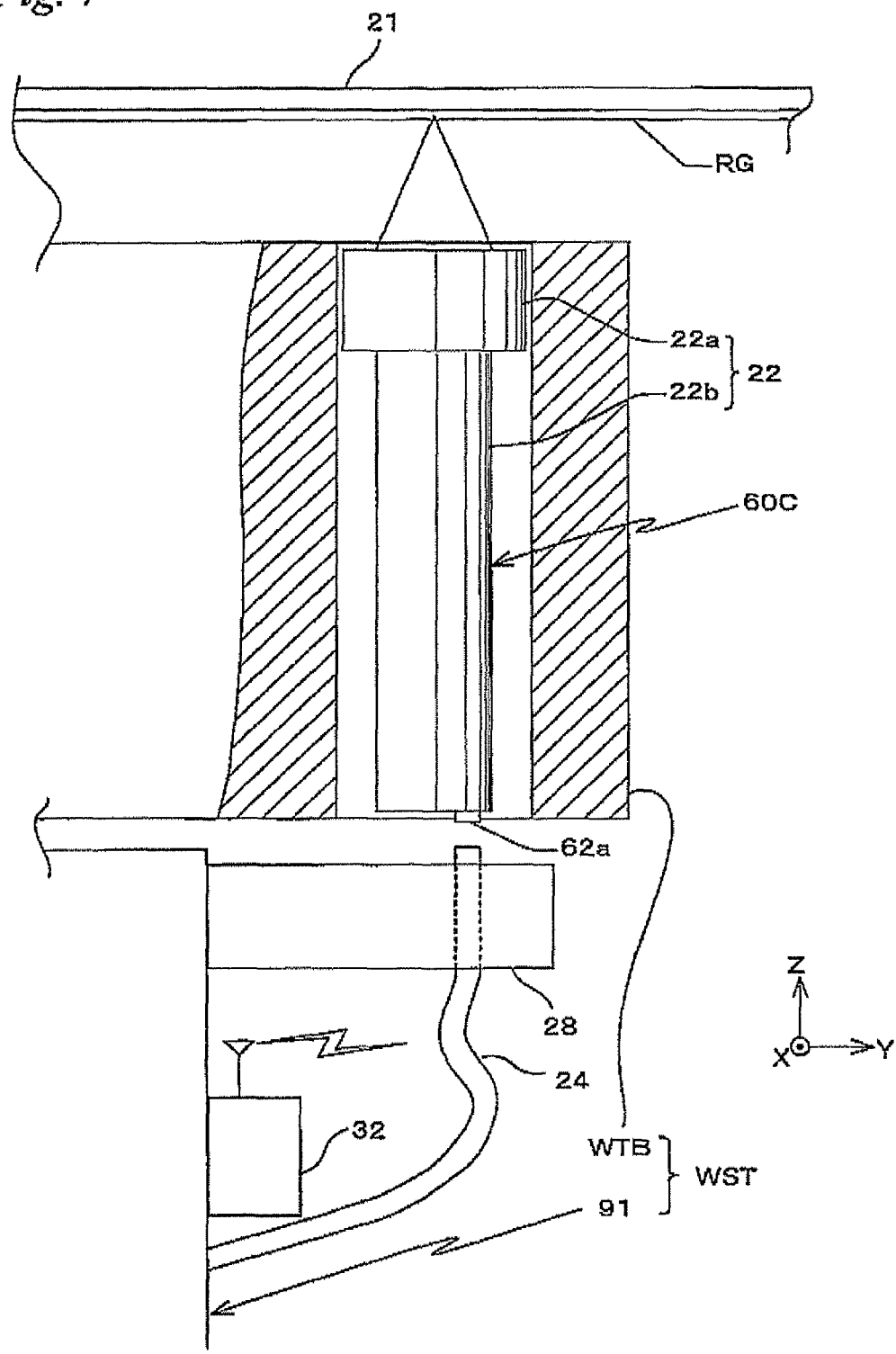
FIG. 7 is a partially broken enlarged view of a wafer stage which configures an exposure apparatus of the second embodiment.

As is shown in FIG. 7, focusing on head 60C as a representative, outside the lower end surface of fiber housing section 22b of housing 22, a short waveguide, such as for example, only one end of optical fiber 62a, is exposed to the outside. In correspondence with this, in fiber holding section 28 of stage main section 91, only optical fiber 24 which is a light-sending fiber is held, facing the one end of optical fiber 62a. Also in this case, optical fiber 24 is held by fiber holding section 28 so that the one end is in parallel with the Z-axis.

As described, in the second embodiment, optical fiber 62b and light-receiving fiber 26 previously described are not arranged.

Figure 8:
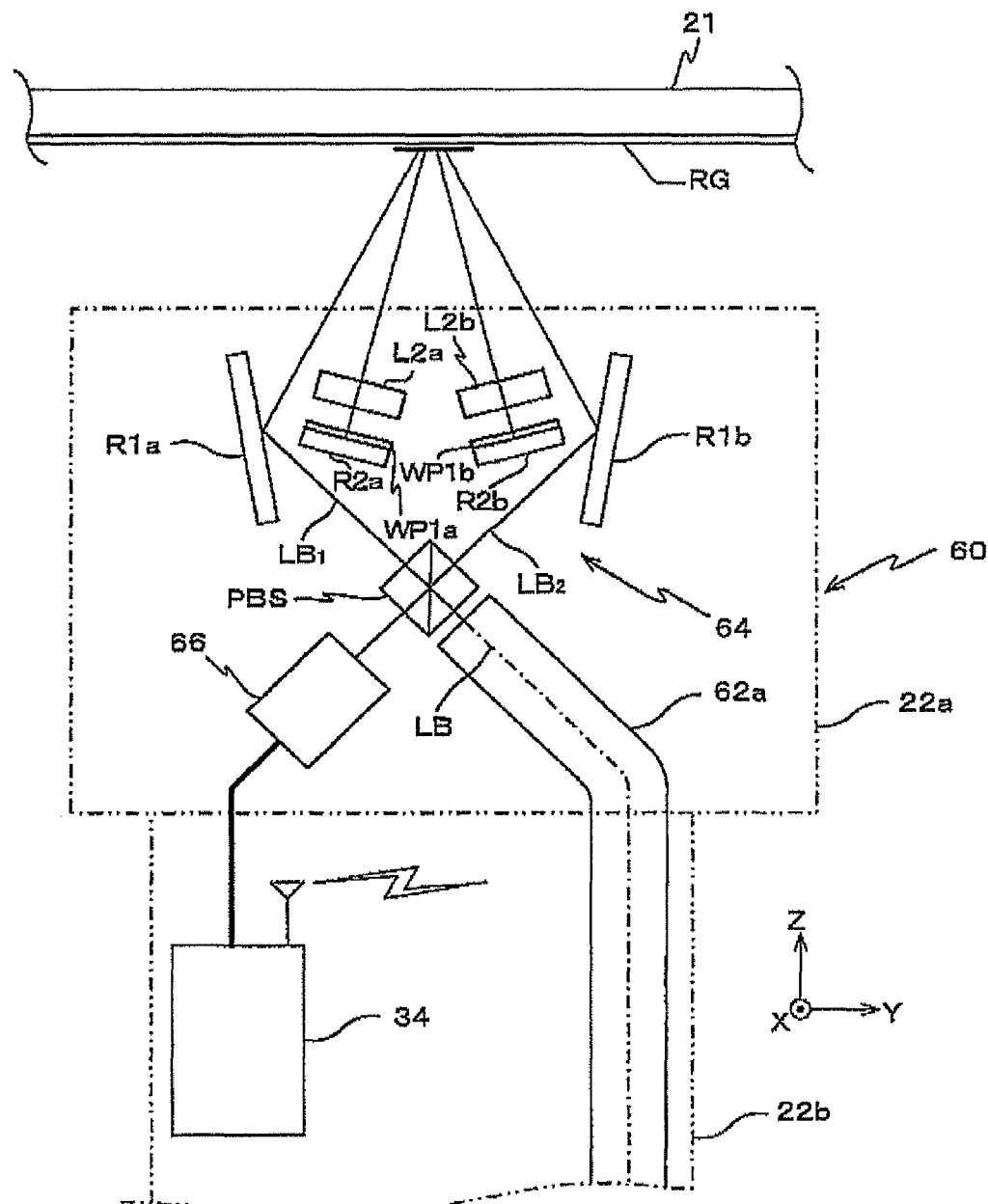
FIG. 8 is a view used to explain an internal configuration of the head in FIG. 7.

FIG. 8 shows an internal configuration of housing 22 of head 60C in the second embodiment. Inside optical system housing section 22a, a photodetection system (including a photodetector) 66 is housed, as well as optical system 64 previously described. Photodetection system 66 is placed facing the outgoing plane of beam splitter PBS. Further, inside fiber housing section 22b of housing 22, a transmitter 34 is housed.

According to Y encoder 70C including head 60C configured in the manner described above, a laser beam LB (measurement beam) from a light source is guided to polarization beam splitter PBS of optical system 64, via optical fiber 24 (refer to FIG. 7) optically connected to the light source (not shown) and optical fiber 62a optically connected to head 60C.

And, this measurement beam is split by polarization by polarization beam splitter PBS into two beams $LB_1$ and $LB_2$. And, these beams $LB_1$ and $LB_2$ reach the two-dimensional diffraction grating RG, via the same path as is previously described.

Diffraction beams of a predetermined order generated from diffraction grating RG by the irradiation of beams $LB_1$ and $LB_2$, such as, for example, the first-order diffraction beams, each reach polarization beam splitter PBS following the same optical path as is previously described, and is synthesized coaxially by polarization bean splitter PBS and is incident on photodetection system 66. Then, the polarization directions of the two first-order diffraction beams described above are uniformly arranged by the analyzer inside photodetection system 66 and the beams interfere with each other to be an interference light, and the interference light is detected by the photodetector and is converted into an electric signal in accordance with the intensity of the interference light. And, the electric signal is modulated by transmitter 34, and then the modulating signal is put on the carrier wave and is sent to receiver 32 wirelessly. In this case, as the carrier wave, an electric wave of a predetermined frequency, such as for example, a microwave or light such as the infrared radiation, can be used. More specifically, a normal wireless transmitter, a microwave transmitter, an infrared transmitter and the like can be used as transmitter 34, and as receiver 32, a receiver corresponding to these equipment can be used. Moreover, similar to the first embodiment above, fiber holding section 28 is made to hold optical fiber 26 which is a light-receiving fiber, and inside fiber housing section 22b, a short waveguide, such as for example, an optical fiber, is arranged optically connected to an output end of transmitter 34. And, the electric signal corresponding to the intensity of interference light output from photodetection system 56 is modulated by transmitter 34 using light as a carrier wave, and air transmission of the optical information, which is the modulating signal placed on the carrier wave (light), can be performed between the optical fiber arranged at the output end of transmitter 34 and optical fiber 26 on the stage main section 91 side by optical transmission (optical communication) which uses air as the transmission medium.

Other heads 60A, 60B, and 60D, and encoders 70A, 70B, and 70D including the heads are configured in a similar manner as head 60C and encoder 70C described above, and function similarly. In the second embodiment as well, the measurement values of each of the encoders are supplied to main controller 20.

According to the exposure apparatus of the second embodiment configured in the manner described above, besides being able to measure positional information of wafer stage WST within the XY plane with good precision without being affected by the fine movement of wafer table WTB, an equivalent effect as exposure apparatus 100 of the first embodiment can be obtained.

Incidentally, when a configuration that houses an irradiation system consisting of a light source such as semiconductor lasers, a converging lens and the like inside the housing of the head is employed, wiring for supplying power to the light source will be necessary. However, such a configuration can be adopted, as long as if the influence caused by the wiring can be ignored. When employing such a configuration, as a configuration of processing the return beams (more specifically, in the case of each of the embodiments above, the synthesized light of the first-order diffraction beam of beam $LB_1$ coaxially synthesized by polarization beam splitter PBS and the first-order diffraction beam of beam $LB_2$) from each head, a configuration similar to the one described in one of the first embodiment and the second embodiment above can be employed.

Incidentally, in each of the embodiments described above while the case has been described where encoder system 70 is equipped with a pair of X heads and a pair of Y heads, the present invention is not limited to this. More specifically, the number of encoder heads need not be specified, however, to measure the positional information (including rotation in the $\theta z$ direction) of wafer stage WST in the XY plane, the encoder should have a total of three heads, including at least one X head and one Y head each.

Incidentally, in each of the embodiments above, the case has been described where the present invention is applied to a scanning stepper; however, the present invention is not limited to this, and can also be applied to a static exposure apparatus such as a stepper. Even if the present invention is applied to a stepper, by measuring the position of the stage on which the object subject to exposure is mounted using an encoder, position measurement error caused by air fluctuation can substantially be nulled, which is different from when measuring the position of the stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus in each of the embodiments above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image.

Further, illumination light IL is not limited to an ArF excimer laser beam (wavelength 193 nm), and can also be an ultraviolet light such as the KrF excimer laser beam (wavelength 248 nm), or a vacuum-ultraviolet light such as the $F_2$ laser beam (wavelength 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, the present invention can be applied to an EUV exposure apparatus that uses an EUV (Extreme Ultraviolet) light in a soft X-ray range (e.g. a wavelength range from 5 to 15 nm). Besides such an apparatus, the present invention can also be applied to an exposure apparatus that uses charged particle beams such as an electron beam or an ion beam. Furthermore, the present invention can be applied to a liquid immersion type exposure apparatus which has liquid filled in the space between the projection optical system and the wafer disclosed in, for example, U.S. Patent Application Publication No. 2005/0259234 and the like.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped masks an equivalent effect as the embodiment above can be obtained by measuring the position of the stage using an encoder.

Further, as is disclosed in, for example, the pamphlet of International Publication No. 2001/035168, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in each of the embodiments above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body system of the present invention can be applied not only to the exposure apparatus, but can also be applied widely to other substrate processing apparatuses (such as a laser repair apparatus, a substrate inspection apparatus and the like), or to apparatuses equipped with a movable stage of a position setting apparatus of a sample or a wire bonding apparatus in other precision machines.

Incidentally, the disclosures of the various publications, the pamphlets of the International Publications, and the U.S. patent application Publication descriptions and the U.S. patent descriptions that are cited in the embodiment above and related to exposure apparatuses and the like are each incorporated herein by reference.

Incidentally, semiconductor devices are manufactured through the steps of; a step where the function/performance design of the device is performed, a step where a reticle based on the design step is manufactured, a step where a wafer is manufactured from silicon materials, a lithography step where the pattern formed on a mask is transferred onto an object such as the wafer by the exposure apparatus in the embodiment above, a development step where the wafer (object) that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, because the exposure apparatus in the embodiment above is used in the lithography step, devices having high integration can be produced with good yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body system including a movable body which moves along a predetermined plane, the system comprising:
    a movable body having a main section which moves along the predetermined plane and a table member which can finely move in at least a direction orthogonal to the predetermined plane and a tilt direction with respect to the predetermined plane on the main section; and
    a measurement device which has a plurality of encoder heads arranged on the table member, and measures positional information of the movable body within the predetermined plane, based on an output of at least one encoder head of the plurality of encoder heads which faces a grating section placed substantially parallel with the predetermined plane outside the movable body, wherein
    the measurement device has a transmitting and receiving equipment which performs transmitting and receiving of a measurement beam and/or a signal by wireless communication between each of the plurality of encoder heads and a component outside the encoder heads,
    the transmitting and receiving equipment has a plurality of optical fibers whose end sections are arranged at the main section each facing each of the plurality of encoder heads, and whose optical axes are substantially parallel to a direction orthogonal to the predetermined plane at the end section, and
    at least one of transmitting and receiving of the measurement beam and air transmission of a signal light is performed between each of the plurality of encoder heads and the end section of the optical fiber facing the encoder head.

2. The movable body system according to claim 1, wherein the transmitting and receiving equipment supplies a measurement beam via each of the plurality of optical fibers to each of the opposing encoder heads.

3. The movable body system according to claim 1, wherein the measurement device detects optical information sent by air transmission from each of the plurality of encoder heads to each of the opposing optical fibers.

4. The movable body system according to claim 1 wherein the transmitting and receiving equipment has a receiver which performs wireless communication with each of the encoder heads and receives output signals from each of the encoder heads.

5. The movable body system according to claim 4 wherein the receiver uses one of a microwave and an infrared radiation to communicate with each of the plurality of encoder heads.

6. The movable body system according to claim 1 wherein the table member is made of a member having a rectangular shape in a planar view, and the encoder head is placed in each of the four corners of the table member.

7. The movable body system according to claim 1 wherein the grating section includes a two-dimensional grating which covers a movement range of the movable body.

8. The movable body system according to claim 1, the system further comprising:
a drive system of the movable body, including a planar motor which drives the main section within the predetermined plane.

9. The movable body system according to claim 1 wherein the table member is supported in a non-contact manner by the main section.

10. A pattern formation apparatus that forms a pattern on an object, the apparatus comprising:
the movable body system according to claim 1 in which the object is mounted on the table member; and
a patterning device which generates a pattern on an object mounted on the table member.

11. The pattern formation apparatus according to claim 10 wherein
the object has a sensitive layer, and the patterning device generates a pattern on the object by an exposure of the sensitive layer by irradiation of an energy beam.

12. An exposure apparatus that forms a pattern on an object by an irradiation of an energy beam, the apparatus comprising:
a patterning device that irradiates the energy beam on the object; and
the movable body system according to claim 1 in which the object is mounted on the table member, whereby
the movable body on which the object is mounted is driven for relative movement of the energy beam and the object.

13. A device manufacturing method, including
exposing an object using the exposure apparatus according to claim 12; and
developing the object which has been exposed.

14. An exposure apparatus that exposes an object with an energy beam, the apparatus comprising:
a stage assembly which has a table member that holds the object and is movable in a direction orthogonal to a predetermined plane, and a main section which supports the table member in a non-contact manner and moves in a direction parallel to the predetermined plane;
a grating section to which the table member faces and is arranged substantially parallel to the predetermined plane; and
a measurement device which has a plurality of encoder heads arranged on the table member, and a transmitting and receiving equipment which performs transmitting and receiving of a measurement beam and/or a signal by wireless communication between each of the plurality of encoder heads and a component outside the plurality of encoder heads, and measures positional information of the table member within the predetermined plane based on an output of at least one encoder head, of the plurality of encoder heads, facing the grating section, wherein
the transmitting and receiving equipment has a plurality of optical fibers whose end sections are arranged at the main section each facing each of the plurality of encoder heads, and whose optical axes are substantially parallel to a direction orthogonal to the predetermined plane at the end section, and
at least one of transmitting and receiving of the measurement beam and air transmission of a signal light is performed between each of the plurality of encoder heads and the end section of the optical fiber facing the encoder head.

15. The exposure apparatus according to claim 14 wherein the stage assembly can move table member in directions of six degrees of freedom.

16. The exposure apparatus according to claim 14 wherein the table member is movable in at least directions of three degrees of freedom including a direction orthogonal to the predetermined plane and rotational directions around two axes orthogonal within a plane parallel to the predetermined plane.

17. The exposure apparatus according to claim 14 wherein the stage assembly includes a planar motor which drives the main section within the predetermined plane.

18. A device manufacturing method, including
exposing an object using the exposure apparatus according to claim 14; and
developing the object which has been exposed.

19. A measurement device arranged in an exposure apparatus exposing an object held by a stage assembly with an energy beam that measures positional information of the object in a predetermined plane, the device comprising:
a plurality of encoder heads which are arranged on a table member of the stage assembly that holds the object and is movable in a direction orthogonal to the predetermined plane; and
a transmitting and receiving equipment in which at least a part of the equipment is arranged at a main section of the stage assembly that supports the table member in a non-contact manner and moves in a direction parallel to the predetermined plane, and which performs transmitting and receiving of a measurement beam and/or a signal by wireless communication between each of the plurality of encoder heads and a component outside the encoder heads, wherein
positional information of the table member within the predetermined plane is measured, based on an output of at least one encoder head of the plurality of encoder heads which faces a grating section arranged substantially parallel with the predetermined plane outside the movable body,
the transmitting and receiving equipment has a plurality of optical fibers whose end sections are arranged at the main section each facing each of the plurality of encoder heads, and whose optical axes are substantially parallel to a direction orthogonal to the predetermined plane at the end sections, and
at least one of transmitting and receiving of the measurement beam and air transmission of a signal light is performed between each of the plurality of encoder heads and the end section of the optical fiber facing the encoder head.

* * * * *